United States Patent [19]
Szeto

[11] Patent Number: 4,730,257
[45] Date of Patent: Mar. 8, 1988

[54] APPARATUS FOR ANALYZING SIGNALS, TO OBTAIN PARAMETERS OF CONSTITUENTS

[76] Inventor: Lai-wan M. Szeto, 57 Axsmith Cres., Willowdale, Ontario, M2J 3K2, Canada

[21] Appl. No.: 695,017

[22] Filed: Jan. 25, 1985

[51] Int. Cl.$^4$ .................................. G01R 23/00
[52] U.S. Cl. .................................. 364/484; 324/77 B
[58] Field of Search ............... 364/484, 485, 724, 726, 364/819, 827; 324/77 B, 77 D; 329/105, 110; 375/10, 88; 382/43; 328/140

[56] References Cited

U.S. PATENT DOCUMENTS

| | | | |
|---|---|---|---|
| 3,903,401 | 9/1975 | Jayant | 364/485 |
| 3,920,978 | 11/1975 | Schmitt et al. | 364/726 |
| 3,984,669 | 10/1976 | Lehmann et al. | 364/726 |
| 4,068,309 | 1/1978 | Drukarch | 364/484 |
| 4,135,243 | 1/1979 | Peregrino et al. | 364/484 |
| 4,144,572 | 3/1979 | Starner et al. | 364/487 |
| 4,178,631 | 12/1979 | Nelson, Jr. | 364/484 |
| 4,279,017 | 7/1981 | Bos et al. | 364/484 |
| 4,301,404 | 11/1981 | Ley | 364/484 |
| 4,310,891 | 1/1982 | Niki | 364/484 |
| 4,319,329 | 3/1982 | Girgis et al. | 364/493 |
| 4,333,150 | 6/1982 | Matty et al. | 364/484 |
| 4,334,273 | 6/1982 | Ikeda | 364/484 |
| 4,363,099 | 12/1972 | Srinivasan et al. | 364/484 |
| 4,363,100 | 12/1982 | Agnew et al. | 364/484 |
| 4,408,284 | 10/1983 | Kijesky et al. | 364/485 |

OTHER PUBLICATIONS

Harris, Fredric J., "On the Use of Windows for Harmonic Analysis with the Discrete Fourier Transform", IEEE, vol. 66, No. 1, Jan. 1978, pp. 51-83.
New Measurement Technique for Tracking Voltage Phasors, IEE Transactions on Power Apparatus and Systems, vol. PAS-102, No. 5, May 1983, pp. 1025-1038.

*Primary Examiner*—Felix D. Gruber
*Attorney, Agent, or Firm*—Rogers, Bereskin & Parr

[57] ABSTRACT

An apparatus for analyzing a signal takes the Fourier Transform of both an original signal and a shifted signal, which has previously been subjected to a shift, for example a time shift, relative to the original signal. This gives sets of first and second frequency components corresponding respectively to the original signal and the shifted signal. The arguments of at least one pair of corresponding first and second frequency components are calculated, and subtracted to give a phase difference. From this phase difference, the frequency of the corresponding constituent of the original signal can be determined. Further, having obtained the frequency, one can calculate the initial phase and amplitude of the corresponding constituent of the original signal. The signal can vary temporally or spatially.

24 Claims, 19 Drawing Figures

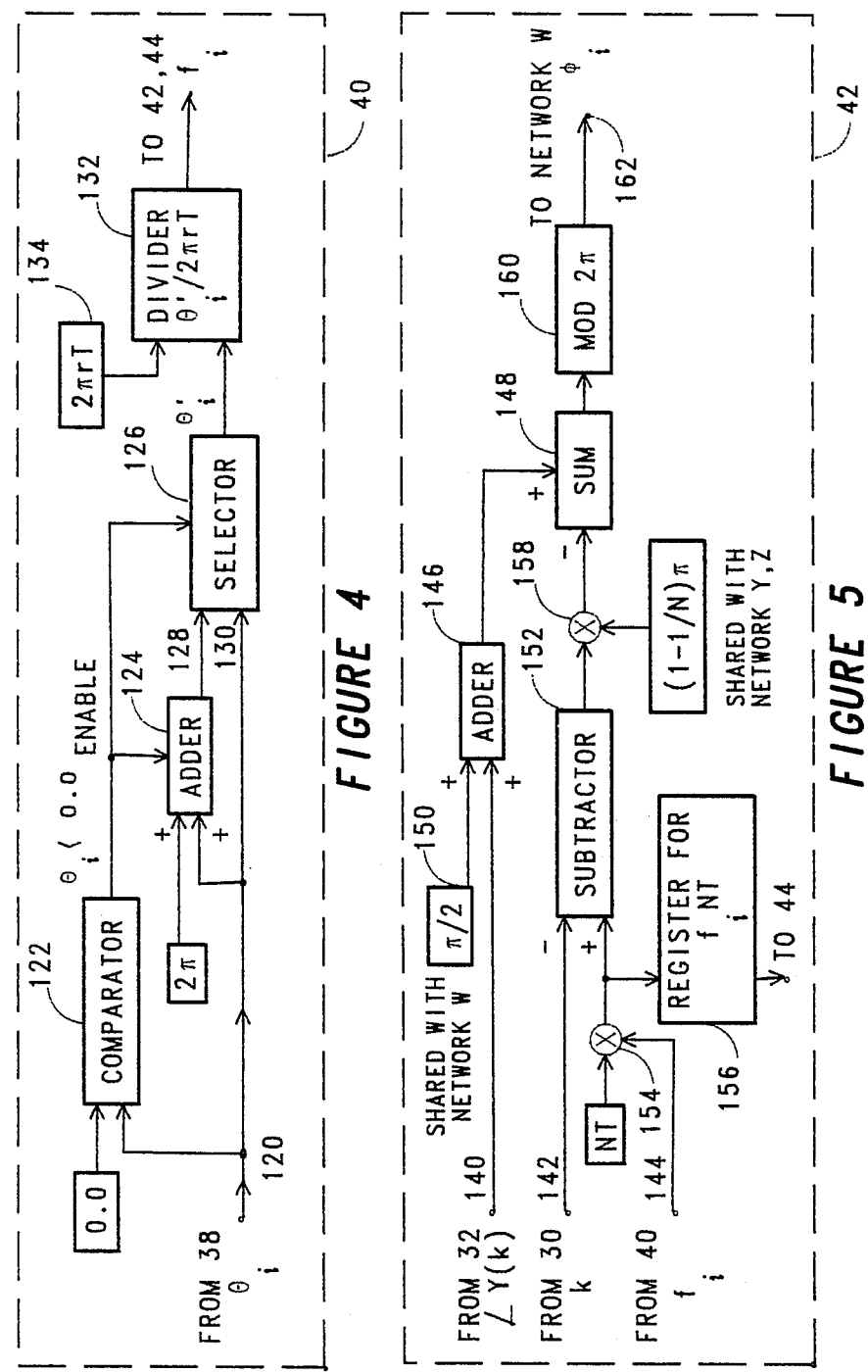

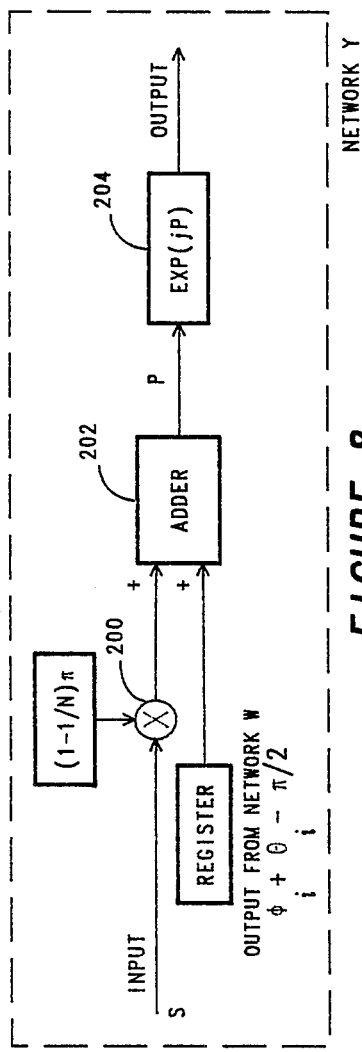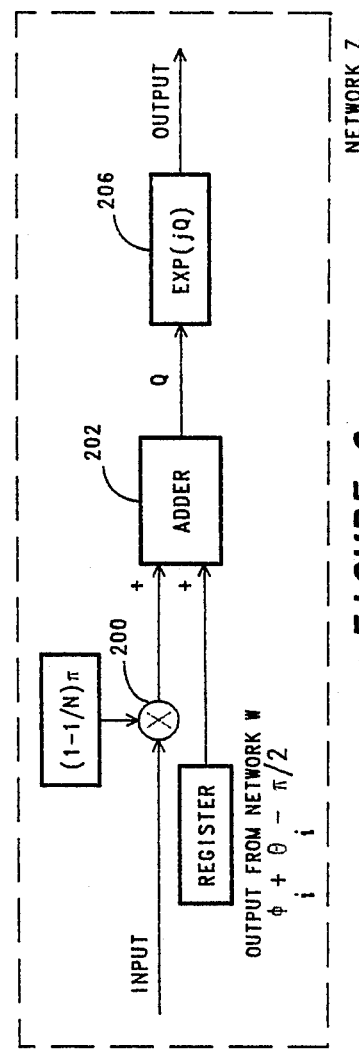

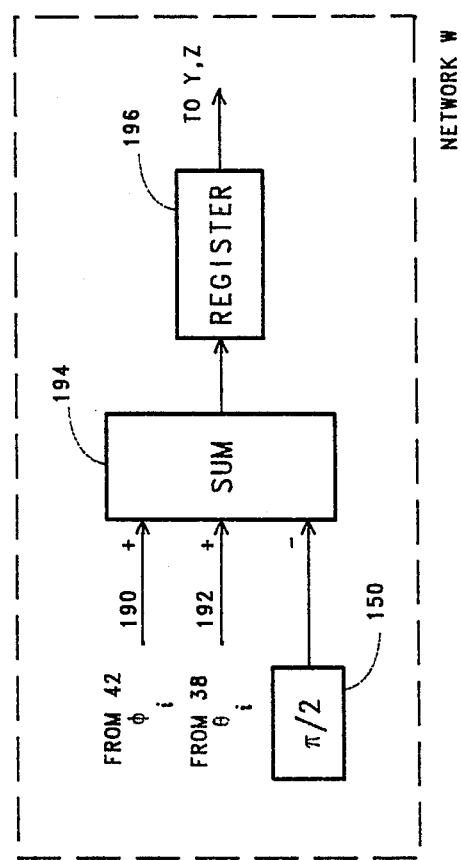

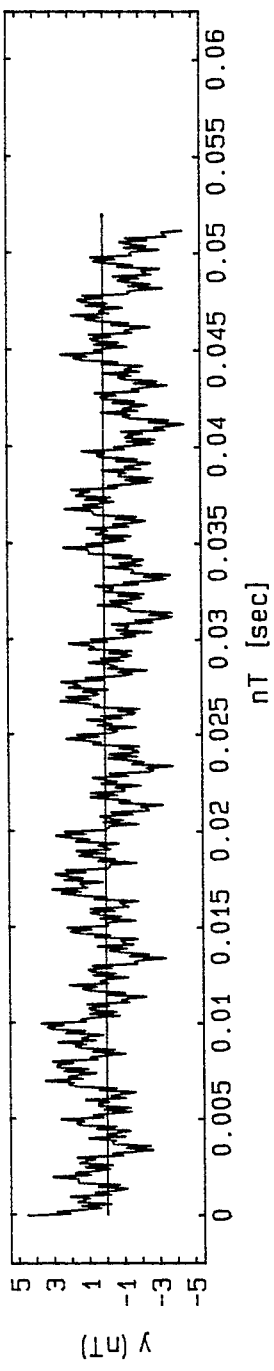
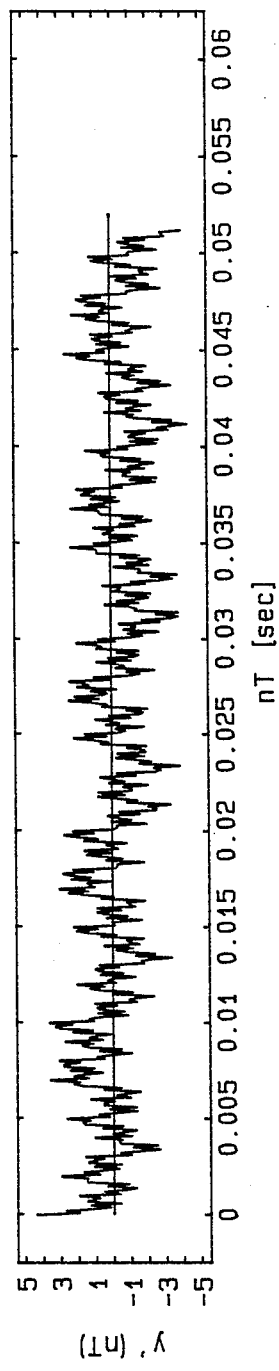
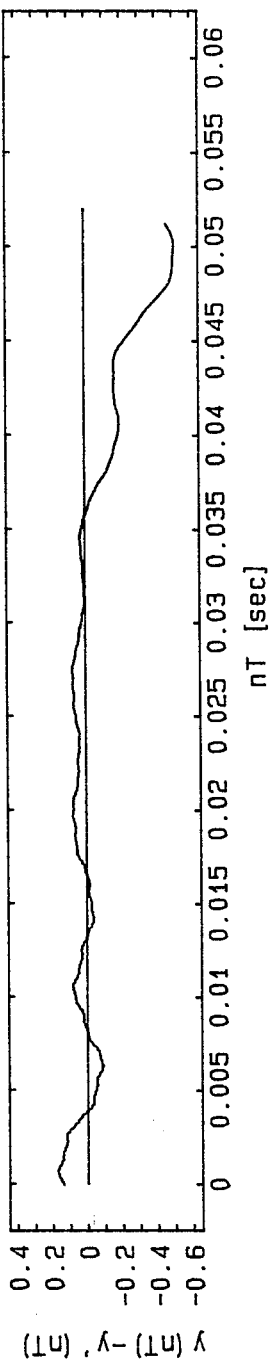

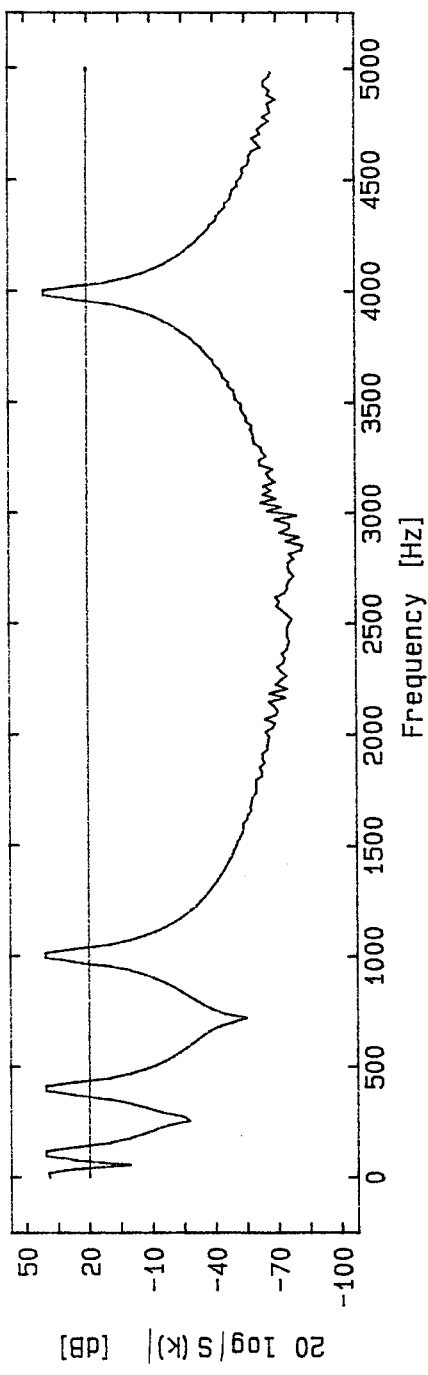
FIGURE 18 : ACTUAL WAVEFORM SPECTRUM
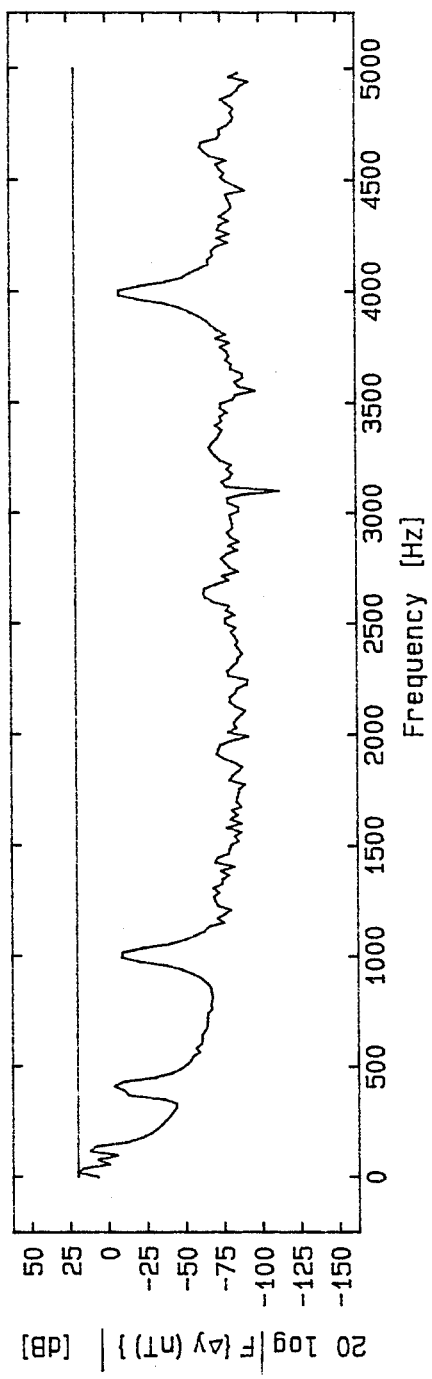
FIGURE 19 : RESYNTHESIS ERROR SPECTRUM

APPARATUS FOR ANALYZING SIGNALS, TO OBTAIN PARAMETERS OF CONSTITUENTS

BACKGROUND OF THE INVENTION

This invention relates to an apparatus for analysing signals comprising a linear combination of a number of sinusoids, or complex exponential functions, each having unknown amplitude, frequency, and initial phase. An additive noise can be present in these signals.

FIELD OF THE INVENTION

There are many fields, (eg. speech, seismic, radar and biomedical processing) in which a wide variety of signals are encountered, which are a summation of sinusoids or complex exponential functions. Some of these signals can have harmonically related frequencies which results in a periodic waveform. Other signals consists of frequencies which are not harmonically related; this results in an irregular waveform. Frequently, it is desirable to be able to analyse the signals, and to break them down into components which can be readily handled for collecting or conveying information. It is known that any function can be expanded in a Fourier series of sinusoids or complex exponential functions. By superposition of the resultant series of sinusoids, or complex exponential functions, one can synthesize or recreate the original waveform.

Many proposals have been made for analysing periodic and complex signals, by spectral analysis methods. Known methods can be categorized as parametric or non-parametric. Conventional methods are based on the Fourier Transform, and are non-parametric. Most modern methods assume a rational transfer function model, ARMA (Auto-Regressive, Moving-Average) and hence they are parametric. Such methods achieve high frequency resolution, at the expense of enormous computations. Such techniques are described in "Spectrum Analysis—A Modern Perspective" by S. K. Kay, and S. L. Marple Junior, in the proceedings of the IEEE, volume 69, No. 11, November, 1981, pages 1380-1419, and in "Digital Signal Processing" edited by N. B. Jones, IEE Control Engineering Series 22, 1982.

The conventional Fourier Transform approach is based on a Fourier series model of the data. Recently, the fast Fourier Transform, and associated algorithms(e.g. the Winograd Fourier Transform and the Prime Factor Fourier Transform) have been suggested, and implemented using high-speed mini-computer, microcomputer, and array processes. It has been possible to compute the power spectral density of sampled data using the Fourier Transform in real-time for a large class of signals. In general, such a technique is fast and relatively easy to implement, and works well for very long sampled data and when the signal-to-noise ratio is low. However, this approach has the disadvantage that it lacks adequate frequency precision when the number of samples is small. This becomes more of a problem when the signal has time varying parameters, as for example in the case of speech. The frequency precision in Hertz is approximately equal to a discrete frequency in size, which is the reciprocal of the observation interval. Likewise the frequency resolution in multi-dimensional analysis is inversely proportional to the extent of the signal. Also, one has the problem of spectral leakage, due to the implicit windowing of the data resulting from the finite number of samples. This distorts the spectrum, and can further reduce the frequency precision. Since this is a non-parametric approach, both the amplitude and the phase spectrum are required to unambiguously represent a signal in the time domain.

Modern spectral estimation methods, developed in the past two decades, are based on a time series model ARMA, mentioned above. Such methods can have the advantage of providing higher frequency resolution. However, it should be noted that such higher frequency resolution can be achieved only under large signal-to-noise ratios. When this ratio is low, these methods do not give better frequency resolution than the classical Fourier Transform method. The computational requirements of these methods are much higher, and this makes them uhattractive, and possibly impractical, for real-time processing.

The Pisarenko Harmonic Decomposition method is a special ARMA model. Whilst this model can have some advantages, it does not include initial phases, and therefore this information is lost. It requires calculation of autocorrelation functions, and a computationally complex eigenequation solution. Evaluation of the order may involve several solutions of eigenequation. When incorrect order is used, spurious components or incorrect frequencies will be introduced with biased power estimates.

The extended Prony method has been developed for a signal consisting of real undamped sinusoids in noise. Whilst it does not require estimation of the autocorrelation functions, it requires the solution of two sets of simultaneous linear equations and a polynomial root solving, a difficult task.

When expanding a function consisting of a series of sinusoids or complex exponential functions, one needs to know the frequency, amplitude and initial phase of each component. Traditionally, the phase spectrum of the Fourier Transform has been ignored. It has generally been believed that the amplitude spectrum is more important than the phase spectrum, because the amplitude spectrum shows explicitly the signal's frequency content. Indeed, in some techniques, the initial phase information has been lost. Further, known techniques cannot be simultaneously both fast and accurate.

It is desirable to provide a method, and an apparatus for, expanding or analysing a signal into a series of sinusoids or complex exponential functions, which can be carried out in real time. The technique should give the frequency, initial phase and amplitude of all components, and further should be applicable to signals where these three parameters may vary but are nearly constant over a short observation interval. In other words, this method should work for reasonably few samples in short time or interval analysis.

SUMMARY OF THE INVENTION

According to the present invention, there is provided a method of analysing a signal, the method comprising the steps of:

(i) Taking the Fourier Transform of a signal, on a first basis set to create a plurality of first frequency components representative of the signal;

(ii) Separately applying a shift to said signal to create a shifted signal;

(iii) Taking the Fourier Transform of the shifted signal on a second basis set to create a plurality of second frequency components representative of the shifted signal;

(iv) Obtaining the arguments of at least one pair of corresponding first and second frequency components;

(v) Subtracting the arguments of the corresponding first and second components, to derive a phase difference; and (vi) Obtaining the frequency of the corresponding constituent of the original signal from the respective phase difference;

The present invention is based on the realization that, a shift of a signal only causes change in the phase term in frequency domain. In addition, at a frequency basis that is close to the frequency of a particular sinusoid or complex exponential function in the signal, the argument and magnitude of the frequency constituent can be approximated by the phasor (or phasors for certain windows) of the sinusoid or complex exponential function at this frequency basis. It is expected that the tecnnique will frequently be applied to a time-varying signal and in this case the shift will be a time shift. However, the technique can be applied to many situations where one parameter varies with another parameter.

To determine the parameters of the sinusoids forming a time-varying signal, one should compare the original signal and a time-shifted signal, to obtain a set of phase differences at dominant spectral components. The frequencies of the dominant or main spectral components can then be quickly, and simply obtained from the phase differences. Once the frequencies are known, the initial phases and amplitudes of the dominant spectral components can also be obtained. In contrast to known techniques, the method of the present invention can be readily implemented in real time, and does not require a large number of samples.

In accordance of another aspect of the present invention, there is provided an apparatus, for use in analysing a signal, to determine the dominant spectral constituents thereof, the apparatus comprising:

(i) Delay means, for applying a delay to an input signal, to create a shifted signal;

(ii) First transform means for applying a Fourier Transform to an original signal, to create a plurality of first frequency components;

(iii) Second transform means for applying a Fourier Transform to the shifted signal to create a plurality of second frequency components;

(iv) Argument obtaining means, for obtaining the arguments of the corresponding first and second frequency components;

(v) Phase difference obtaining means, connected to the argument obtaining means; and (vi) Frequency calculation means, connected to the phase difference obtaining means, for obtaining the frequencies of the constituents of the original signal from said phase differences.

From the obtained phase difference, one determines the frequency. This can be used to obtain the initial phase, and the amplitude of the corresponding constituent of the original signal can then be obtained. This can be applied to decomposing a signal to obtain the dominant components, or detecting the presence of a particular frequency.

BRIEF DESCRIPTION OF THE DRAWINGS

For a better understanding of the present invention, and show more clearly how it may be carried into effect, reference will now be made, by way of example, to the accompanying drawings, which show embodiments of the present invention, and in which:

FIG. 4 shows a block diagram of a frequency obtaining unit, forming part of the apparatus of FIG. 1;

FIG. 5 shows a block diagram of an initial phase obtaining unit, forming part of the apparatus of FIG. 1;

FIG. 8 shows another network forming part of the amplitude obtaining unit of FIG. 6;

FIG. 9 shows another network forming part of the amplitude obtaining unit of FIG. 6;

FIG. 10 shows the further network forming part of the amplitude obtaining unit of FIG. 6;

FIG. 15 shows a graph of an original signal generated from parameters of table 1;

FIG. 16 shows a graph of a resynthesized signal generated from parameters of table 2;

FIG. 17 is a graph of the estimation error;

FIG. 18 is a graph of the frequency spectrum for the original signal; and

FIG. 19 is a graph of the frequency spectrum of the estimation error of FIG. 17.

DESCRIPTION OF THE PREFERRED EMBODIMENTS

As mentioned, the present invention is applicable to many different signals, whether periodic or non-periodic. The signals can vary temporally or spatially. Further, the signal can comprise sinusoids or complex exponential functions. In some cases a parameter of interest may be analogous to frequency, but is not strictly an operating frequency. For example, a radar is used to determine the distance of objects. It transpires that one needs to sample the signal for discrete variations in the operating frequency, and in this case the distance becomes in effect the frequency parameter of the signal to be analysed. For simplicity, the invention is described only in relation to a time varying signal comprising sinusoids, although it can be applied to such other signals.

Figure 1:
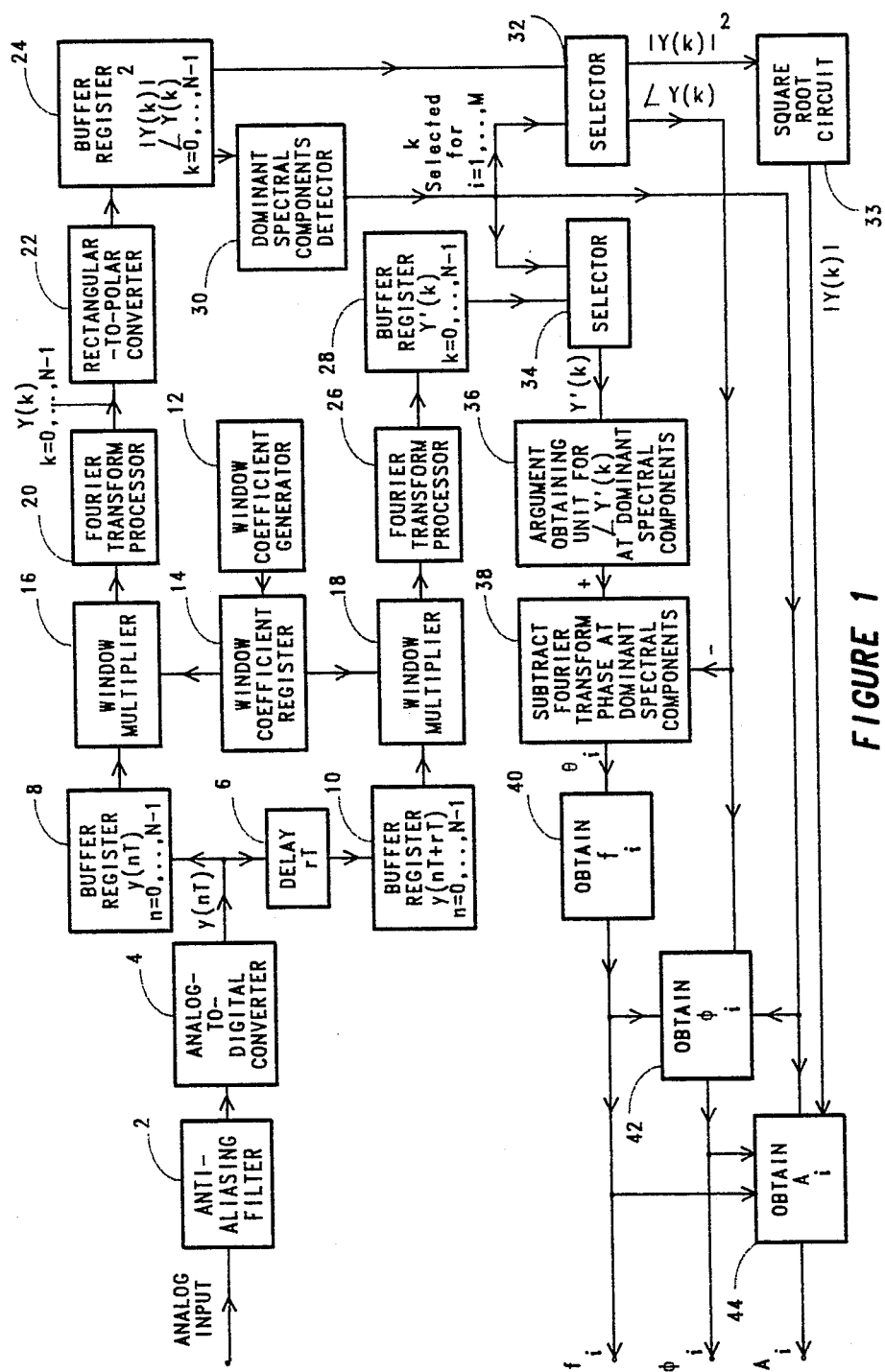
FIG. 1 shows a block diagram of a first embodiment of an apparatus in accordance with the present invention.

Referring first to FIG. 1, there is shown in block form a circuit of an apparatus, for implementing the present invention. In known manner, the circuit includes an anti-aliasing filter 2, which has an input for an analog signal. The output of the anti-aliasing filter 2 is connected to an analog-to digital converter 4, where the analog input is converted to a digital signal. For a digital input, a digital antialiasing filter would be used. This digital signal is represented by y(nT), where n is an integer that is an index for the discrete sample data and where T is a sampling period in seconds. Here, we are concerned with signals which comprise of a limited number of sinusoids. As is known, this signal can be represented as in the following equation:

$$y(nT) = \sum_{i=1}^{M} A_i \mathrm{Sin}(2\pi f_i nT + \phi_i) + A_0 \qquad \text{Eqn (1)}$$

$n = 0,1,2,\ldots, N-1$ where
  T=the sampling periods in seconds
  n=an interger, index for the discrete sampled data
  N=total number of samples within the time window
  $A_i$=amplitude of ith simusoid
  $f_i$=frequency of ith sinusoid
  $\phi_i$=initial phase of ith simusoid
  $A_o$=D.C. component.

As set out in this equation, it is assumed that various parameters, namely the amplitude, frequency and initial phase do not vary for each component of the signal. There are of course many signals in which these parameters vary considerably. However, there are also other signals in which these parameters are either constant as assumed, or only vary slowly with time. In the latter case, for a short time period, one can assume that they are constant.

In accordance with the present invention, it is necessary to process both the original signal and a time-shifted signal. In the present embodiment, this is achieved by providing two separate processing lines. In a first, upper processing line, there is a buffer register 8, in which values of the signal are stored.

At the same time, the lower processing line commences with a time delay unit 6, in which a time delay rT is added to the original, signal. As a result, a time-shifted signal is obtained, which can be represented by the following equation:

$$y(nT + rT) = \sum_{i=1}^{M} A_i \mathrm{Sin}(2\pi f_i(n+r)T + \phi_i) + A_0 \qquad \text{Eqn (2)}$$

$r$ = an integer
$n = 0,1,2,\ldots, N-1$

This equation shows one of the well-known properties of the Fourier Transform, which states that if a signal is advanced in time by rT seconds, then the spectrum will be modified by a linear phase shift of $2\pi f_i rT$.

The second processing line includes a corresponding second buffer. register 10, in which values of the time-shifted signal are stored. One then has the original signal and the time-shifted signal in the two buffer registers 8, 10. Timing is controlled such that when the buffer registers are storing data in regular intervals of time, the downstream apparatus operate on the previous time frames. The two buffers can also be combined to form only one buffer with extra samples for the time delay and connections to both processing lines.

In accordance with the present invention, it is necessary to effect a Fourier Transform of these two signals. To provide the necessary window function, a window coefficient generator 12 is provided to supply the window coefficient to a window coefficient register 14 at initialization. The window coefficient register 14 is connected to window multipliers 16, 18 in the two processing lines. Each window multiplier 16, 18 serves to multiply data from a respective buffer register 8, 10 by the chosen window function. Different window functions can be used, depending upon the characteristics required. For simplicity, a simple rectangular window can be used. Alternatively, one could use a Hanning window or a Hamming window. It should be borne in mind that the finite samples results in a spectral leakage problem. By careful choice of the window function, the leakage problem can be reduced.

Then, in the two processing lines there are Fourier Transform processors 20, 26. These Fourier Transform processors 20, 26 effect a discrete Fourier Transform of the windowed signal, to produce a periodic extension in time of the windowed signal. For a rectangular window, projections of the original signal on the basis set which expands the entire signal space can be obtained as the following equation:

$$Y(k) = \tfrac{1}{2} \sum_{i=1}^{M} A_i \left\{ \frac{\mathrm{Sin}\pi(f_i NT - k)}{\mathrm{Sin}\frac{\pi}{N}(f_i NT - k)} \exp\left(j\left[\phi_i - \frac{\pi}{2} + (1 - 1/N)(f_i NT - k)\pi\right]\right) \right. $$
$$\left. + \frac{\mathrm{Sin}\pi(f_i NT + k)}{\mathrm{Sin}\frac{\pi}{N}(f_i NT + k)} \exp\left(-j\left[\phi_i - \frac{\pi}{2} + (1 - 1/N)(f_i NT + k)\pi\right]\right) \right\} + A_0 \delta(k) \qquad \text{Eqn (3)}$$

where $k = 0,1,2,\ldots, N-1$ is an ordered index for the basis.

A corresponding equation can be obtained for the transform of the time-shifted signal.

As can be seen from this equation, for any k in the discrete frequency domain, the Fourier Transform Y(k) is a resultant of a number of complex vectors. These vectors are projections of all sinusoids on the kth basis. For the ith sinusoid, the projections will be stronger on the closest kth basis where:

$f_i NT \approx k$

In other words, when the discrete frequency corresponding to the kth basis is close to $f_i$ provided that no other sinusoid has a frequency close to the same basis, the amplitude of the first complex vector for this particular sinusoid i is much higher than the amplitude of all the other complex factors making up that component. Due to the small contribution of the other factors, the resultant Y(k) is almost equal to this complex factor, and we can write:

$$\mathrm{Amp}[Y(k)]|_{k=f_i NT} \approx \tfrac{1}{2} \frac{A_i \mathrm{Sin}\pi(f_i NT - k)}{\mathrm{Sin}\frac{\pi}{N}(f_i NT - k)} \qquad \text{Eqn (4)}$$

$$\mathrm{Arg}[Y(k)]|_{k=f_i NT} \approx \phi_i - \frac{\pi}{2} + \pi(1 - 1/N)(f_i NT - k) \qquad \text{Eqn (5)}$$

In these equations, the approximately equals sign is used for accuracy, but for clarity in the following discussion an ordinary equals sign is used.

Now, for the time-shifted signal y (nT+rT), one obtains a similar equation. From the Fourier Transform of this equation and using the similar argument to that outlined above, we can show that for the sinusoid i, we get the following:

$$Amp[Y(k)]|_{k=f_iNT} = \frac{A_i \sin \pi (f_i NT - k)}{\sin \frac{\pi}{N} (f_i NT - k)} \qquad \text{Eqn (6)}$$

and $$Arg[Y(k)]|_{k=f_iNT} = 2\pi f_i rT + \phi_i - \frac{\pi}{2} + \pi(1 - 1/N)(f_i NT - k) \qquad \text{Eqn (7)}$$

Comparison of equations 4 and 5 with the corresponding equations 6 and 7 will show that, as expected, the magnitude of the amplitude is unchanged, and that the argument is altered by a phase shift term $2\pi f_i rT$. Accordingly, as the time shift is varied, the amplitude remains unchanged, but the respective phase difference varies.

Figure 2:
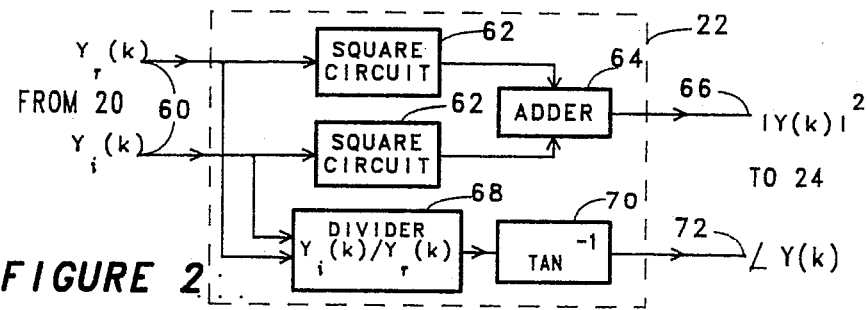
FIG. 2 shows a block diagram of a rectangular-to-polar converter forming part of the apparatus of FIG. 1.

In the first signal line, following the Fourier Transform processor 20, there is a rectangular-to-polar converter 22, in which the output of the processor 20 is converted to polar coordinates. The rectangular-to-polar converter is shown in detail in FIG. 2. As indicated at 60, it has inputs for the real and imaginary parts of each component of the signal Y, namely $Y_r(k), Y_i(k)$ The inputs 60 are connected to respective square circuits 62, in which the real and imaginary parts are squared. These squared quantities are then added in an adder 64, to give the squared value of the amplitude of each component as indicated at an output 66. The inputs 60 are further connected to a divider 68 in which the imaginary part of each component is divided by the real part. The resultant is transmitted to a unit 70 in which the operator TAN$^{-1}$ is performed. This gives the argument of each component at an output 72.

A buffer register 24 receives the output of the converter 22, and stores the squared values of the amplitude and the argument for each component of the transformed signal.

Figure 3:
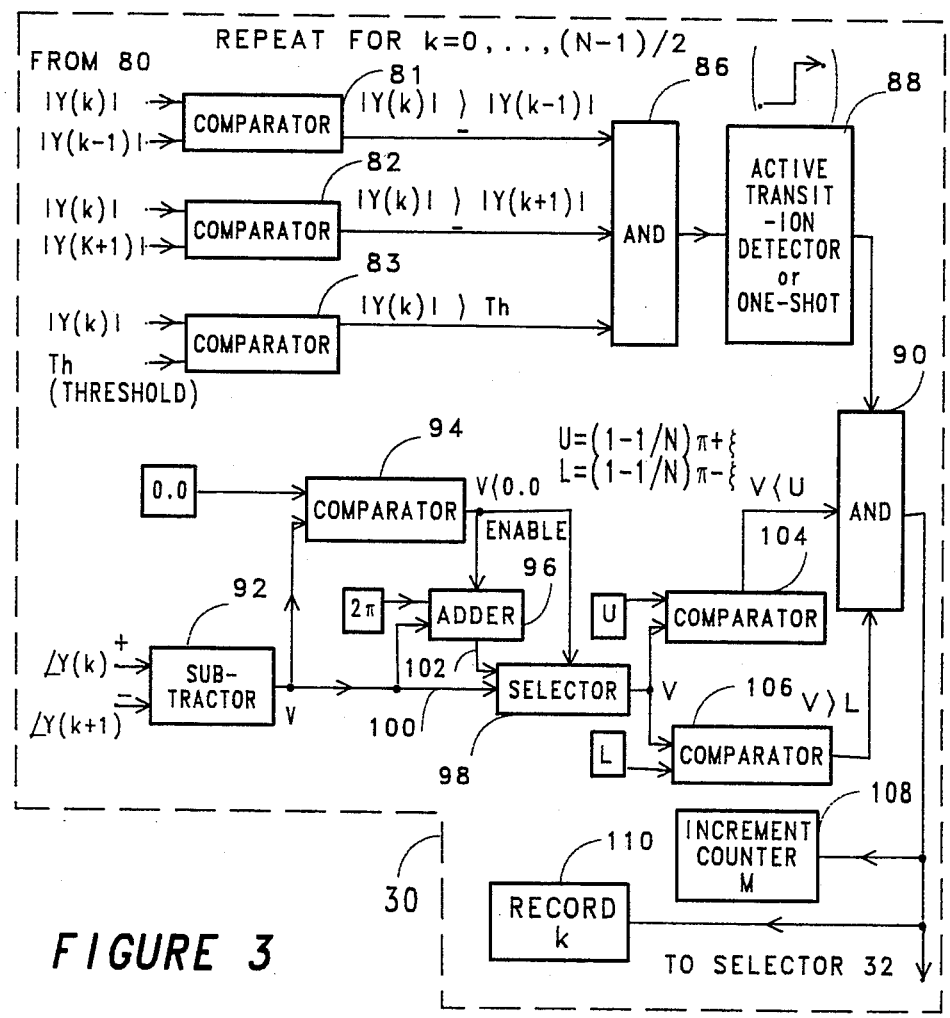
FIG. 3 shows a block diagram of a dominant spectral components detector forming part of the apparatus of FIG. 1.

A dominant spectral components detector 30 is connected to the buffer register 24, and processes the data stored therein, to determine the dominant spectral components. The dominant spectral components detector is shown in detail in FIG. 3. As detailed below, two different techniques are combined, to determine the dominant spectral components.

Here, we use the convention: $|Y(k)|$ is the magnitude of Y(k). As shown, there are inputs 80 for three comparators 81, 82 and 83. For each index k, the first comparator 81 is provided with $|Y(k)|$ and $|Y(k-1)|$. In the first comparator 81, these two quantities are compared, and a 1 signal transmitted, if $|Y(k)|$ is greater than or equal to $|Y(k-1)|$. Similarly, for the second comparator 82, the quantities $|Y(k)|$ and $|Y(k+1)|$ are supplied to the inputs. These two quantities are compared, and if $|Y(k)|$ is greater or equal to $|Y(k+1)|$, a one signal is sent. For the third comparator 83, the quantity $|Y(k)|$ and a threshold signal Th are supplied to the inputs.

These two values are compared, and if $|Y(k)|$ is greater than the threshold value, a one signal is transmitted.

The outputs of the three comparators 81, 82, 83 are connected to an AND gate 86. The output of this AND gate 86 is connected to a one shot device 88, which responds to a positive going input. The output of the device 88 is in turn connected to one input of a final AND gate 90.

In use, it will be seen that the AND gate 86 only produces an output, when it has three positive inputs. For this, it is necessary that $|Y(k)|$ is greater than or equal to both $|Y(k-1)|$ and $|Y(k+1)|$ as well as being greater than a threshold level. In other words, this arrangement detects the presence of a local peak. Since the comparators 81, 82 will transmit a positive signal when $|Y(k)|$ is equal to $|Y(k-1)|$ and $|Y(k+1)|$, a plateau formed from a set of three or two equal values of Y(k) could cause the AND gate to transmit two or three separate positive signals, indicative of separate peaks. In order to ensure that, for such a plateau, only one indication of a peak or maxiumum is given, the one shot unit 88 is included. Where one has two or three equal values of $|Y(k)|$ greater than the values of the two adjacent Y(k) points, and the threshold value, then a positive signal will be transmitted by the AND gate 86, for each point. However, as the unit 88 only responds to a positive going input, it will only respond to the first maximum $|Y(k)|$ value, as this sends the input of the unit 88 positive. For subsequent equal values of $|Y(k)|$, the input of the device 88 remains positive but is not subject to a positive going input so no further signal will be transmitted from it.

Whilst the comparators are shown processing the quantities $|Y(k)|$, they could equally process $|Y(k)|^2$ as these are the actual values stored in the buffer register 24.

As a further check on the presence of the peak or maximum, indicative of a dominant spectral component, the arguments of the Y(k) values are used. Examination of equation 5 will show that the difference between the phases of adjacent Fourier Transforms in the spectrum at dominant spectral components is equal to $(1 - 1/N)\pi$. This characteristic is used to determine the presence of a dominant spectral component.

A subtractor 92 has two inputs, to which the values of the argument of Y(k) and Y(k+1) are supplied. These two arguments are then subtracted to give the phase difference. It is possible that this phase difference is negative. For this reason, a comparator 94 is provided. In the comparator 94, the value of the phase difference V is compared with a 0 value. If the phase difference is positive, i.e. greater than 0, then no signal is transmitted from the comparator 94. If the phase difference V is negative, then a signal is transmitted from the comparator 94 to an adder 96 and to a selector 98. In the adder 96, the value $2\pi$ is added to the phase difference V, to make it positive. In the absence of a signal from the comparator 94, the selector 98 takes the phase difference V supplied to an input 100. When enabled by the comparator 94, the selector 98 takes a signal from the adder 96 at an input 102. The selected signal, representative of the phase difference is then transmitted to two final comparators 104 and 106.

The two comparators 104, 106 have two further inputs supplied with two values U and L, representative of upper and lower limits, these being given by the following equations.

$$U = (1 - 1/N)\pi + \xi$$

$$L = (1 - 1/N)\pi - \xi'$$

where $\xi = \xi' = 0.2$, or other chosen value. As indicated, the comparator 104 determines whether the phase difference signal is less than the upper limit, whilst the comparator 106 determines if the phase difference signal is greater than the lower limit. If these two conditions are met, then positive signals are transmitted from both comparators 104, 106, to the final AND gate 90. Accordingly, for a signal to be transmitted from the AND gate 90, it must receive an indication from the one shot device 88 that the $|Y(k)|$ value is a maximum, and an indication from the two comparators 104, 106 that the phase difference meets the requirement for a dominant spectral component. With these conditions met, a positive signal is transmitted to an increment counter 108 and a recorder 110. The increment counter 108 counts the number of dominant spectral components detected, these being given the index M, whilst the recorder 110 records the k value of that dominant spectral component. Further, as indicated, the signal from the AND gate 90 is transmitted to selectors 32, 34 (FIG. 1).

It is to be appreciated that the two tests for a dominant spectral component need not both be used. For some applications, one could use just the magnitude text, whilst for other applications one could use the argument test.

On the basis of the k values of the dominant spectral components, the selector 32 selects the values of the square of the amplitude and the argument for the dominant spectral components. The square of the amplitude is transmitted to a square root circuit 33, which determines the amplitude of that component. The argument is transmitted to a phase difference obtainer 38. Simultaneously, the selector 34 selects the various Y(k) components of the time-shifted signal from the buffer register 28, corresponding to the dominant spectral components. These are then transmitted to an argument obtaining unit 36. In this unit 36, the arguments of the dominant spectral components are obtained. This is achieved in a similar manner to the derivation for the original signal, effected in the rectangular-to-polar converter 22, as shown by components 68, 70 in FIG. 2.

A subtraction unit 38 is then supplied with the arguments of the components of the original and the time-shifted signal for the dominant spectral components. These arguments are subtracted to give a set of phase difference values $\theta_i$.

These phase differences $\theta_i$ are then supplied to a frequency obtaining unit 40. This frequency obtaining unit 40 is shown in detail in FIG. 4. It has an input 120 which is connected to a comparator 122 and to an adder 124. Further, the input 120 is connected to a selector 126. The comparator 122 compares the phase difference value with a zero input. If the phase difference value is less than 0, then it sends a positive or enable signal to the adder 124 and the selector 126. The adder then takes the phase difference input, adds the value to $2\pi$ to it to make a positive value, and transmits the positive phase difference value to the selector 126. When enabled by the comparator 122, the selector 126 takes the signal at its input 128, and transmits this to a divider 132. When the original phase difference value is positive, no signal is sent by the comparator 122, and the selector then transmits the original phase difference value received at its input 130 to the divider 132. As detailed above, the phase difference $\theta_i$ is equal to $2\pi f_i rT$. Accordingly, in the divider 132, the phase difference is divided by the quantity $2\pi rT$, this value being stored in a unit 134. The output of the divider then gives the frequency for each sinusoid, namely $f_i$. The frequency values for all the dominant spectral components are then transmitted to an initial phase calculation unit 42 and an amplitude calculation unit 44.

The initial phase obtaining unit 42 is shown in detail in FIG. 5. It has three inputs 140, 142 and 144. These three inputs are connected respectively to: the selector 32 to receive the arguments of the dominant spectral components of the original signal; to the dominant spectral components detector 30 via the selector 32, to receive the k indices corresponding to the dominant spectral components; and to the frequency obtaining unit 40, to receive the frequencies of the dominant spectral components. The input 140 is connected to an adder 146, in which a fixed value $\pi/2$ is added to the argument, and this sum is transmitted to a summation unit 148. Note that the fixed value of $\pi/2$ is provided from a device 150, which is common with a network W, described below. The second input 142 is connected to a subtraction unit 152. The third input 144 is connected to a multiplication unit 154, in which it is multiplied by a fixed value NT the resultant $f_i$NT is stored in a register 156, for use in the amplitude obtaining unit 44. This resultant is also transmitted to the subtractor 152, in which the corresponding k index is subtracted from it. The output of the subtractor 152 is transmitted to a multiplication device 158, in which it is multiplied by a value $(1 - 1/N)\pi$. The output of the multiplication unit 158 is also connected to the summation unit 148, in which it is subtracted from the output of the adder 146. It will be seen that the output of the summation unit 148 is: $<Y(k) + \pi/2 - (1 - 1/N)\pi(f_iNT - k)$ It will be seen that this is the value of the initial phase, corresponding to equation 5. This value of the initial phase is passed through a modular $2\pi$ device 160, to give a positive initial phase in the range $(0, 2\pi)$ at an output 162.

Turning to the amplitude obtaining unit 44, it will be seen that this unit comprises a number of individual networks X, Y and Z. These individual networks will be described, before a description is given of the whole amplitude obtaining unit 44.

Similar to equation 3, it can be shown that, at each dominant spectral component, there are from each sinusoid six elements making up that dominant spectral component, so that both the Hanning or Hamming window could be used. Each element has an amplitude derived by a respective network X, and an argument derived by a respective network Y or Z.

$\alpha = 0.54$ for Hamming window
$\alpha = 0.50$ for Hanning window
$\alpha = 1$ for rectangular window.

$$Y(k) = \frac{\alpha}{2} \sum_{i=1}^{M} A_i \left[ e^{j[2\pi f_i rT + \phi_i - \frac{\pi}{2} + (1 - \frac{1}{N})\pi(f_iNT - k)]} \frac{\sin \pi(f_iNT - k)}{\sin \frac{\pi}{N}(f_iNT - k)} + \right.$$

(Eqn 8)

$$e^{-j[2\pi f_i rT + \phi_i - \frac{\pi}{2} + (1 - \frac{1}{N})\pi(f_i NT + k)]} \frac{\text{Sin}\pi(f_i NT + k)}{\text{Sin}\frac{\pi}{N}(f_i NT + k)} \Bigg] -$$

$$\frac{(1-\alpha)}{4} \sum_{i=1}^{M} A_i \Bigg[ e^{j[2\pi f_i rT + \phi_i - \frac{\pi}{2} + (1 - \frac{1}{N})\pi(1 + f_i NT - k)]} \frac{\text{Sin}\pi(1 + f_i NT - k)}{\text{Sin}\frac{\pi}{N}(1 + f_i NT - k)} +$$

$$e^{j[2\pi f_i rT + \phi_i - \frac{\pi}{2} + (1 - \frac{1}{N})\pi(-1 + f_i NT - k)]} \frac{\text{Sin}\pi(-1 + f_i NT - k)}{\text{Sin}\frac{\pi}{N}(-1 + f_i NT - k)} +$$

$$e^{-j[2\pi f_i rT + \phi_i - \frac{\pi}{2} + (1 - \frac{1}{N})\pi(-1 + f_i NT + k)]} \frac{\text{Sin}\pi(-1 + f_i NT + k)}{\text{Sin}\frac{\pi}{N}(-1 + f_i NT + k)} +$$

$$e^{-j[2\pi f_i rT + \phi - \frac{\pi}{2} + (1 - \frac{1}{N})\pi(1 + f_i NT + k)]} \frac{\text{Sin}\pi(1 + f_i NT + k)}{\text{Sin}\frac{\pi}{N}(1 + f_i NT + k)} \Bigg]$$

This equation is the equation for the time-shifted signal. For the original signal, the term $2\pi f_i rt$, which equals $\theta_i$, is dropped or set to zero.

It can be seen from the above equation that, for a rectangular window only two elements from each sinusoid make up the frequency component and consequently the circuit could be considerably simplified for just a rectangular window. The amplitude obtaining unit 44 derives the values of the magnitude for each sinusoid making up the signal, as given by the following equation:

$$A_i = |Y(k)|/|R|$$

where

To further simplify the hardware for unit 44, the negative frequency elements in equation 9 can be eliminated. Thus the networks $X_4$, $X_5$, $X_6$ and $Z$ are eliminated from unit 44.

Figure 7:
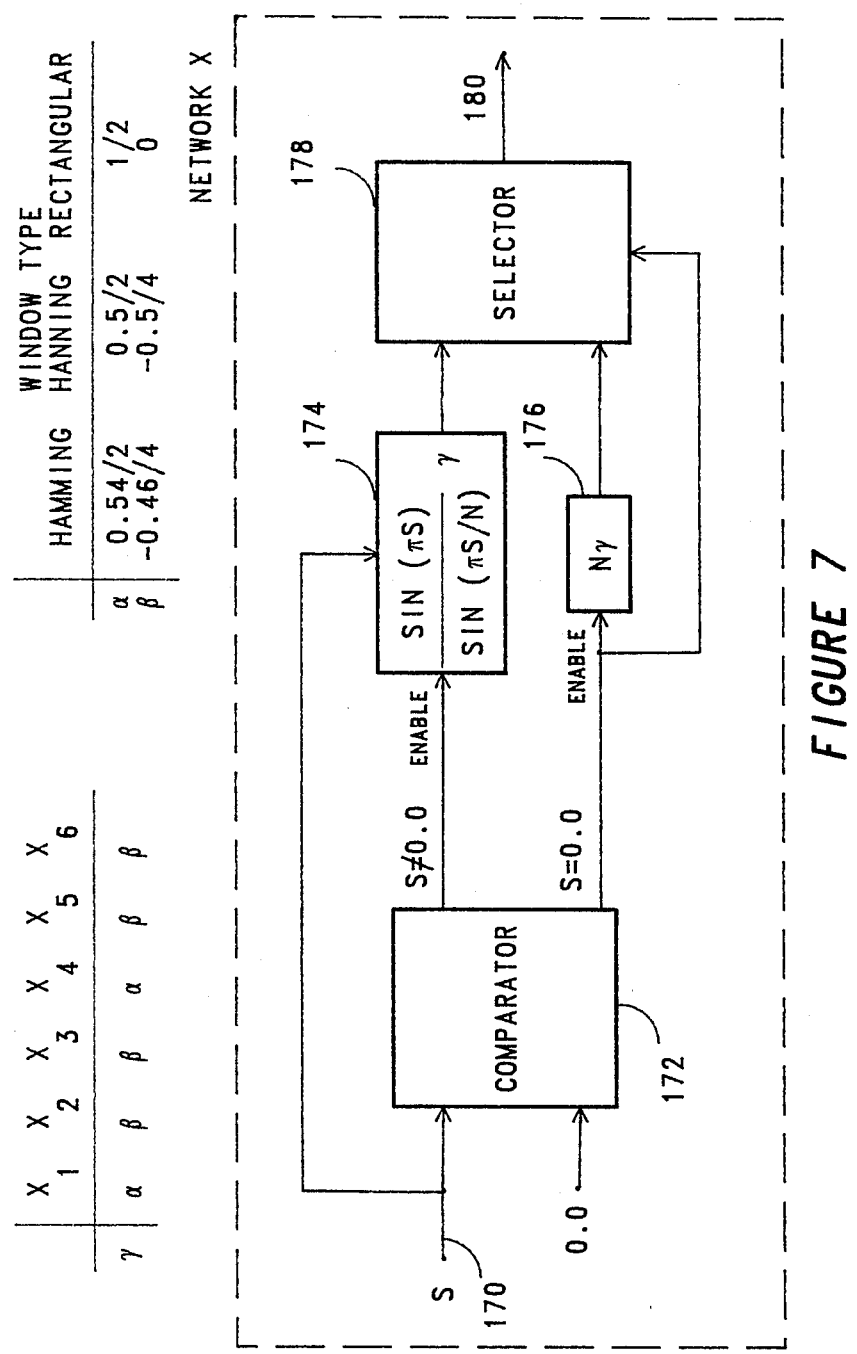
FIG. 7 shows a network forming part of the amplitude obtaining unit of FIG. 6.

Turning to FIG. 7, there is shown a schematic of a network X, together with tables indicative of the values of a co-efficient $\gamma$, for the various different networks X. Each network X has an input 170, which receives a respective input signal S, as explained below for the amplitude obtaining unit 44. This input is connected to a comparator 172, which determines whether the input signal S is zero or not. The comparator 172 has two enabling outputs connected to a derivation unit 174 and (Eqn 9)

$$R = \frac{\alpha}{2} \Bigg[ e^{j[2\pi f_i rT + \phi_i - \frac{\pi}{2} + (1 - \frac{1}{N})\pi(f_i NT - k)]} \frac{\text{Sin}\pi(f_i NT - k)}{\text{Sin}\frac{\pi}{N}(f_i NT - k)} +$$

$$e^{-j[2\pi f_i rT + \phi_i - \frac{\pi}{2} + (1 - \frac{1}{N})\pi(f_i NT + k)]} \frac{\text{Sin}\pi(f_i NT + k)}{\text{Sin}\frac{\pi}{N}(f_i NT + k)} \Bigg] -$$

$$\frac{1-\alpha}{4} \Bigg[ e^{j[2\pi f_i rT + \phi_i - \frac{\pi}{2} + (1 - \frac{1}{N})\pi(1 + f_i NT - k)]} \frac{\text{Sin}\pi(1 + f_i NT - k)}{\text{Sin}\frac{\pi}{N}(1 + f_i NT - k)} +$$

$$e^{j[2\pi f_i rT + \phi_i - \frac{\pi}{2} + (1 - \frac{1}{N})\pi(-1 + f_i NT - k)]} \frac{\text{Sin}\pi(-1 + f_i NT - k)}{\text{Sin}\frac{\pi}{N}(-1 + f_i NT - k)} +$$

$$e^{-j[2\pi f_i rT + \phi_i - \frac{\pi}{2} + (1 - \frac{1}{N})\pi(-1 + f_i NT + k)]} \frac{\text{Sin}\pi(-1 + f_i NT + k)}{\text{Sin}\frac{\pi}{N}(-1 + f_i NT + k)} +$$

$$e^{-j[2\pi f_i rT + \phi - \frac{\pi}{2} + (1 - \frac{1}{N})\pi(1 + f_i NT + k)]} \frac{\text{Sin}\pi(1 + f_i NT + k)}{\text{Sin}\frac{\pi}{N}(1 + f_i NT + k)} \Bigg]$$

a fixed value unit 176. The input signal S is also supplied to the derivation unit 174. When S does not equal 0, then the unit 174 is enabled, to determine the value of the function: $\gamma \operatorname{Sin}(\pi S)/\operatorname{Sin}(\pi S/N)$. When S is equal to 0, then the fixed value unit 176, is activated to provide a value determined from L'Hopital's rule. A selector 178 receives the outputs of the two units or devices 174, 176, together with an enabling signal; it selects the appropriate input signal and communicates this to an output 180, dependent upon the enabling signal. The value of the constant $\gamma$ is chosen in accordance with the two tables, the constant varying for different windows and for the six different networks X. By way of example, values are given for a rectangular window, and for Hanning and Hamming windows.

As each of the networks Y, Z requires one input which is common to the two networks, a separate network W is provided for obtaining this input signal. Network W is shown in FIG. 10. It has an input 190 for the initial phase obtained by the phase obtaining unit 42, for each of the dominant spectral components. It also has an input 192 for the phase difference signals $\theta_i$ although this would be omitted for the original signal. As mentioned above, a fixed value unit 150 containing the value $\pi/2$, common to the initial phase calculation unit 42, is also provided at an input. A summation unit 194 is connected to these three inputs, and sums the initial phase, the phase difference, and substracts the fixed value $\pi/2$, to give an output of: $\phi_i + \theta_i - \pi/2$. The values of this output for the different dominant spectral components are stored in a register 196, for use in the networks Y, Z.

The network Y is shown in FIG. 8. It has an input for the signal S, connected to a multiplication device 200. A fixed value device, supplies the value $(1-1/N)\pi$, to the multiplication device 200. The output of the device 200 is connected to a summation device or adder 202, where it is added with a corresponding output from the network W. This gives a signal P, and a device 204 determines the quantity EXP(jP), which is transmitted to the output.

Referring to FIG. 9, which shows a network Z, the network Z is generally similar to the network Y, and like components are given the same reference. The adder 202 produces an output, which is denoted as Q. In a device 206, the quantity EXP(−jQ) is determined.

Figure 6:
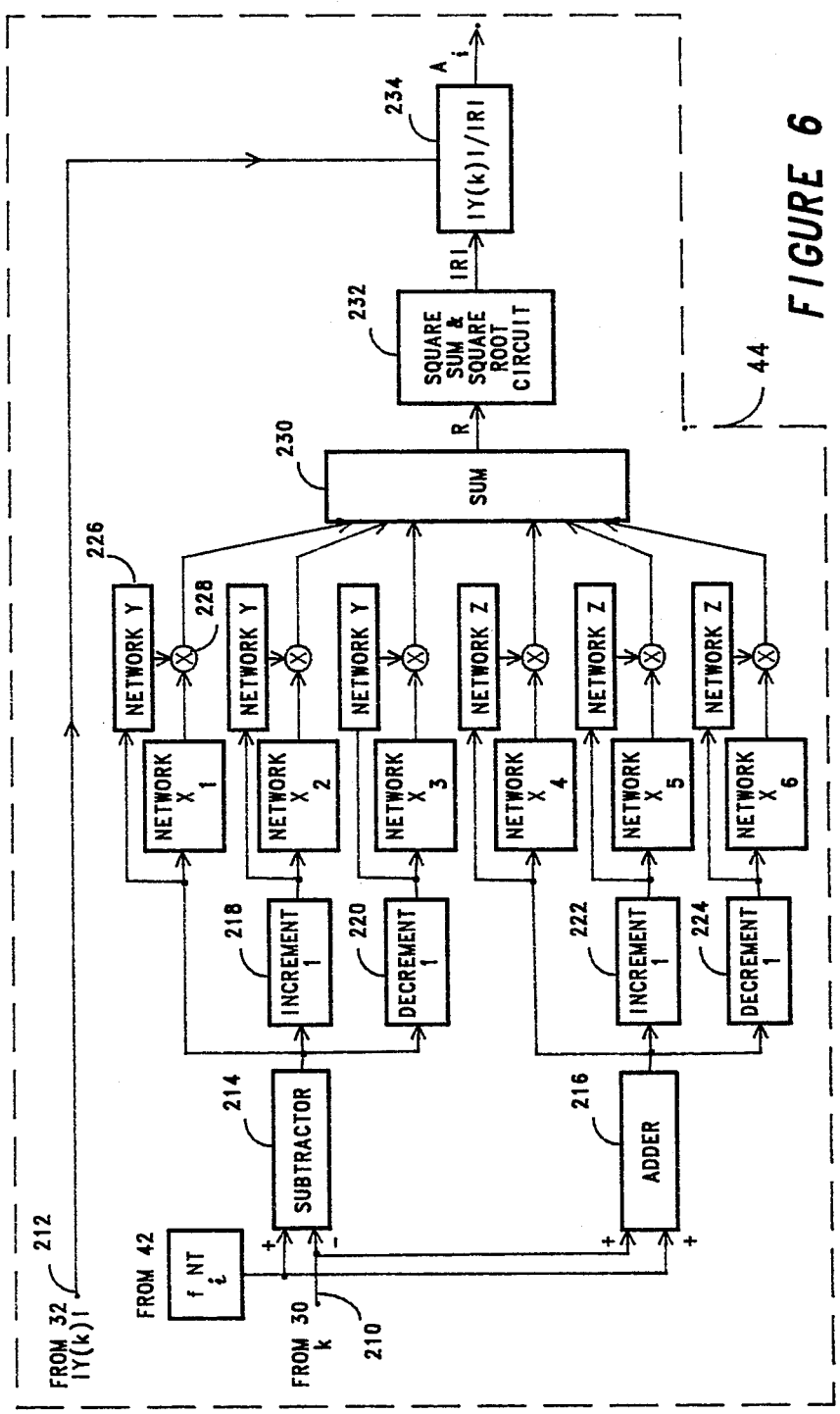
FIG. 6 shows a block diagram of an amplitude obtaining unit, forming part of the apparatus of FIG. 1.

Turning back to the amplitude obtaining unit 44 of FIG. 6, it will be seen that there are provided two inputs 210, 212 connected respectively to the dominant spectral components detector 30, and the selector 32. The input 210 is connected to both a subtractor 214 and an adder 216. A value $f_iNT$ stored in the register 156 is also connected to inputs of the subtractor 214 and adder 216. Consequently, the output of the subtractor 214 is $f_iNT-k$, whilst the output of the adder 216 is $f_iNT+k$.

The subtractor 214 and adder 216 are connected to respective increment and decrement units 218, 220, 222 and 224. The increment units 218, 222 add the quantity 1 to the received signal, whilst the decrement units 220, 224 subtract the quantity 1. The networks $X_1$, $X_4$ receive the ouputs of the subtractor 214 and 216 directly. The networks $X_2$, $X_5$ receive the outputs of the increment units 218, 222 respectively, whilst the networks $X_3$, $X_6$ receive the outputs of the decrement units 220, 224. The networks Y, Z receive inputs corresponding to that received by their corresponding networks X. Since the networks X all behave similarly, and since the networks Y, Z also all behave similarly, a description will just be given of the operation of the network $X_1$ and associated network Y denoted by the reference 226.

The network $X_1$ and the network Y are connected to a multiplication unit 228. The network $X_1$ obtains the magnitude of the element of the transformed component; as explained above, the network $X_1$ receiving the input $f_iNT-K$. The network Y simultaneously obtains the argument for that element, as explained above. This argument and amplitude are then multiplied together by the multiplication device 228, to give a signal representative of that element of the transformed component. A summation unit 230 has inputs for all six elements making up the component of the transformed signal. These are summed, and the sum is transmitted as a signal R to a unit 232. Since the signal contains real and imaginary components, in the unit 232, these real and imaginary components are squared, summed and square rooted to obtain the magnitude of the signal R. This is transmitted to a dividing unit 234, which also receives the signal $1Y(k)1$. In the dividing unit 234, $|Y(k)|$ is divided by $|R|$ to give the amplitude of that dominant spectral component.

A description will now be given of the other embodiments of the present invention shown in FIGS. 11, 12, 13 and 14. In these other embodiments of the present invention, many of the components are the same as in the first embodiment described above. These components are given the same reference numerals, and descriptions of them and their modes of operation are not repeated.

Figure 11:
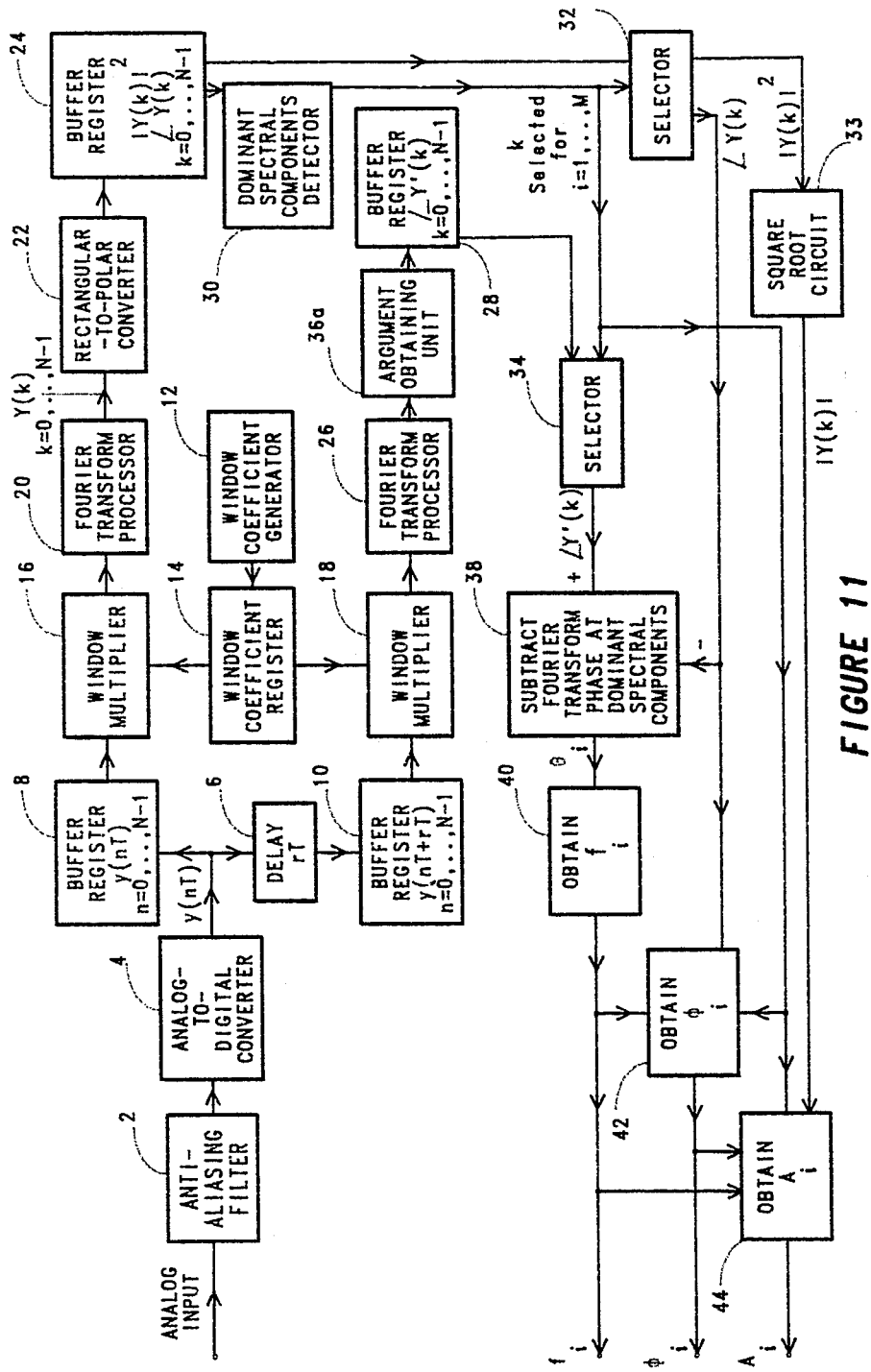
FIG. 11 shows a block diagram of a second embodiment of an apparatus in accordance with the present invention.

Turning to FIG. 11, there is shown a second embodiment, which includes an alternative way of obtaining the arguments of the time-shifted components and the phase differences. Here, the time-shifted processing line includes an argument obtaining unit 36a, which replaces the argument obtaining unit 36 of the first embodiment. This argument obtaining unit 36a is located immediately after the Fourier Transform processor 26. Consequently, the arguments of all the components will be obtained. These are then stored in the buffer register 28. The selector 34 then selects the arguments of the dominant spectral components, and these are supplied to the phase difference obtaining unit 38. This technique may have advantages in some circumstances, although it does require the derivation of some redundant values, namely the arguments of the components which are not dominant spectral components. Otherwise, the remainder of this embodiment functions as the first embodiment.

Figure 12:
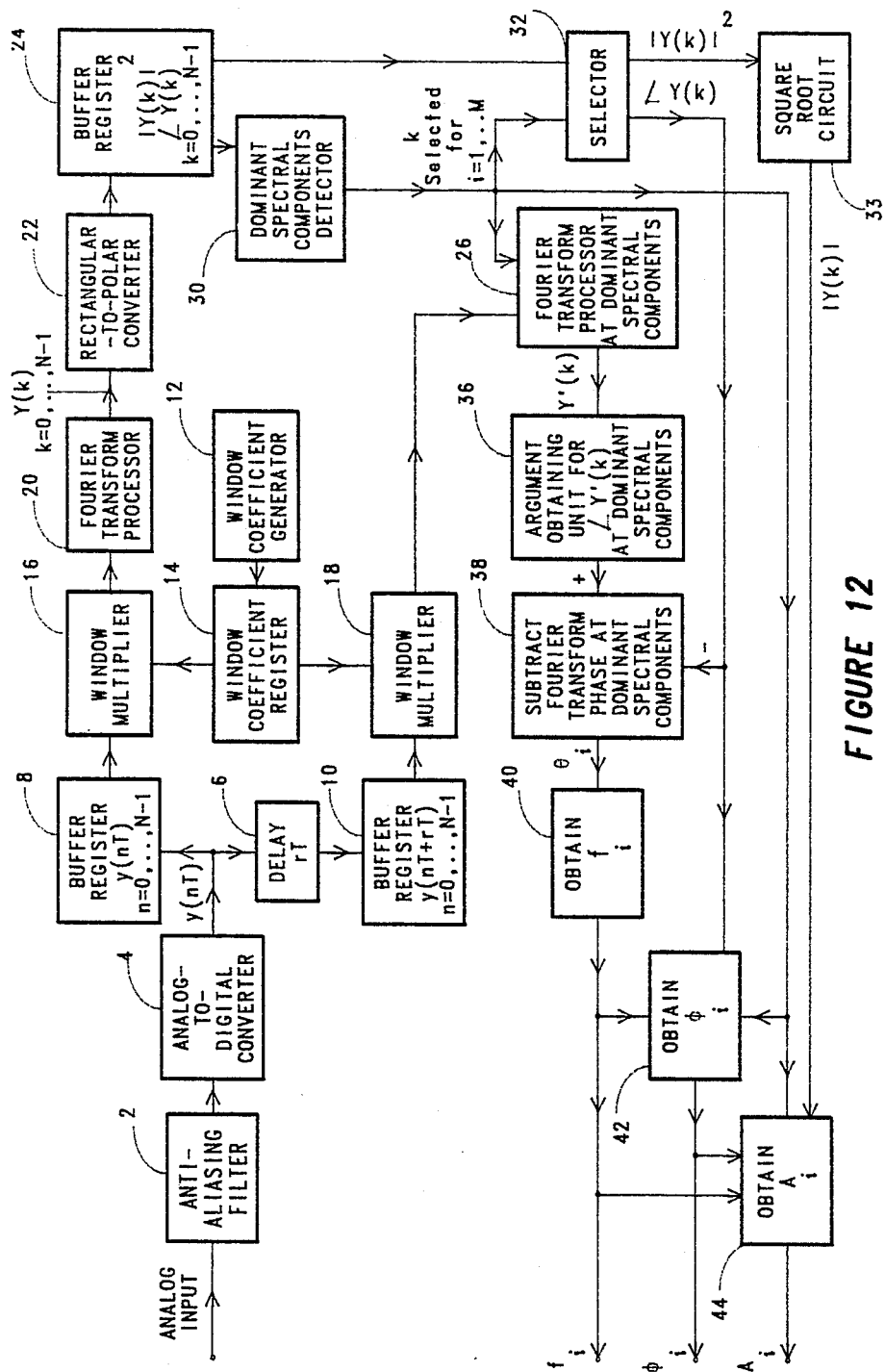
FIG. 12 shows a block diagram of a third embodiment of an apparatus in accordance with the present invention.

With reference to FIG. 12, in this third embodiment, the Fourier Transform processor 26 is connected to the output of the dominant spectral components detector 30. The buffer register 28 and selector 34 of the first embodiment are omitted. The Fourier Transform processor 26 is controlled by the dominant spectral components detector, so as to only obtain the Fourier Transform of the dominant spectral components. These Fourier Transforms are transmitted to the argument obtaining unit 36, in which the respective arguments are obtained. Otherwise, again this circuit functions as for the first embodiment.

As mentioned above, the signal sample taken is of finite length. In effect, a finite signal represents a signal which has already been subjected to a rectangular window. This characteristic can be used to simplify the circuit. One simply takes the finite signal sample available, and operates on this, without subjecting it to a window function. This enables the elimination of the components necessary for producing and applying the window function, namely the components 12, 14, 16 and 18 of FIG. 1.

Figure 13:
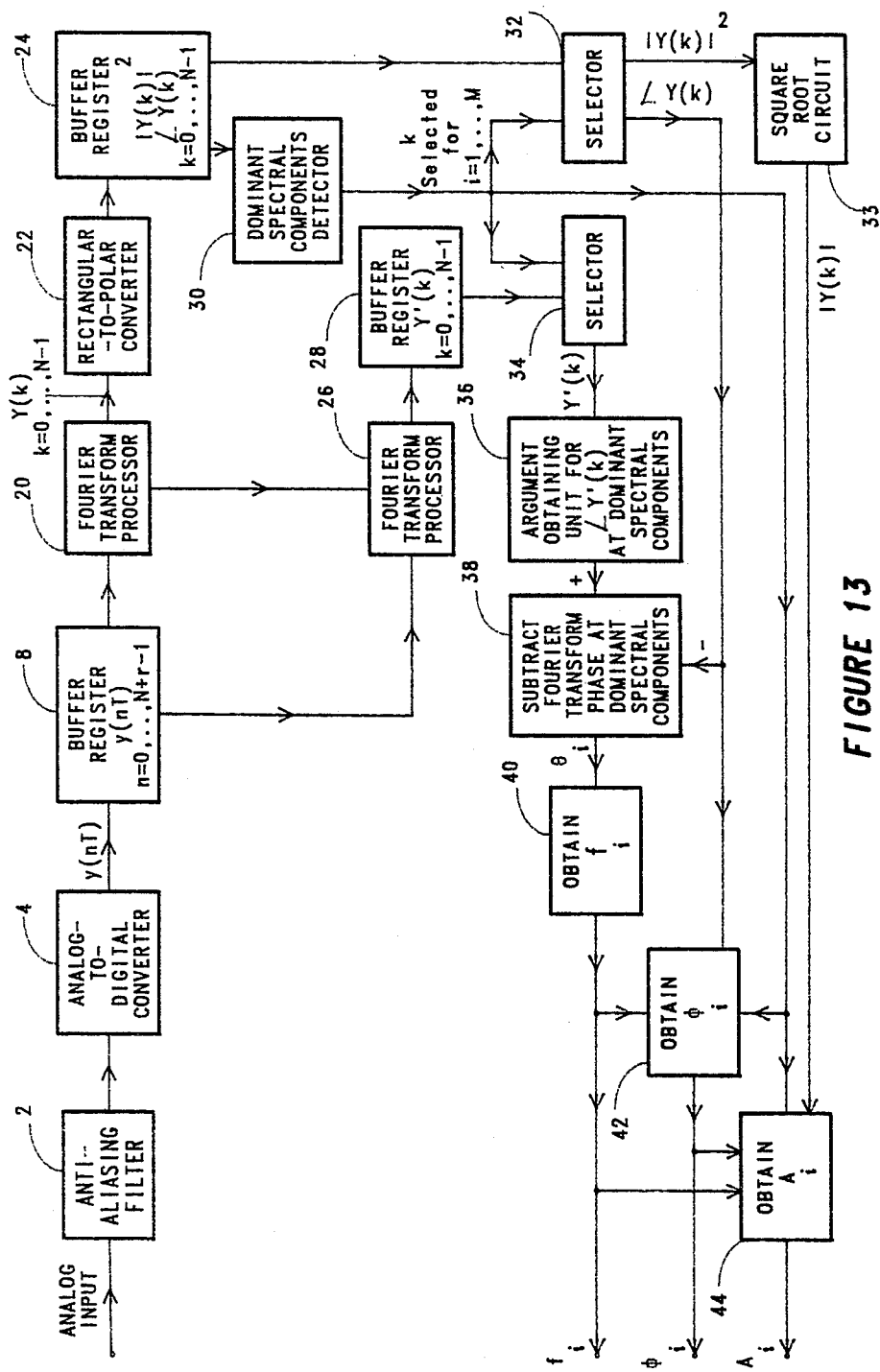
FIG. 13 shows a block diagram of a fourth embodiment of an apparatus in accordance with the present invention.
Figure 14:
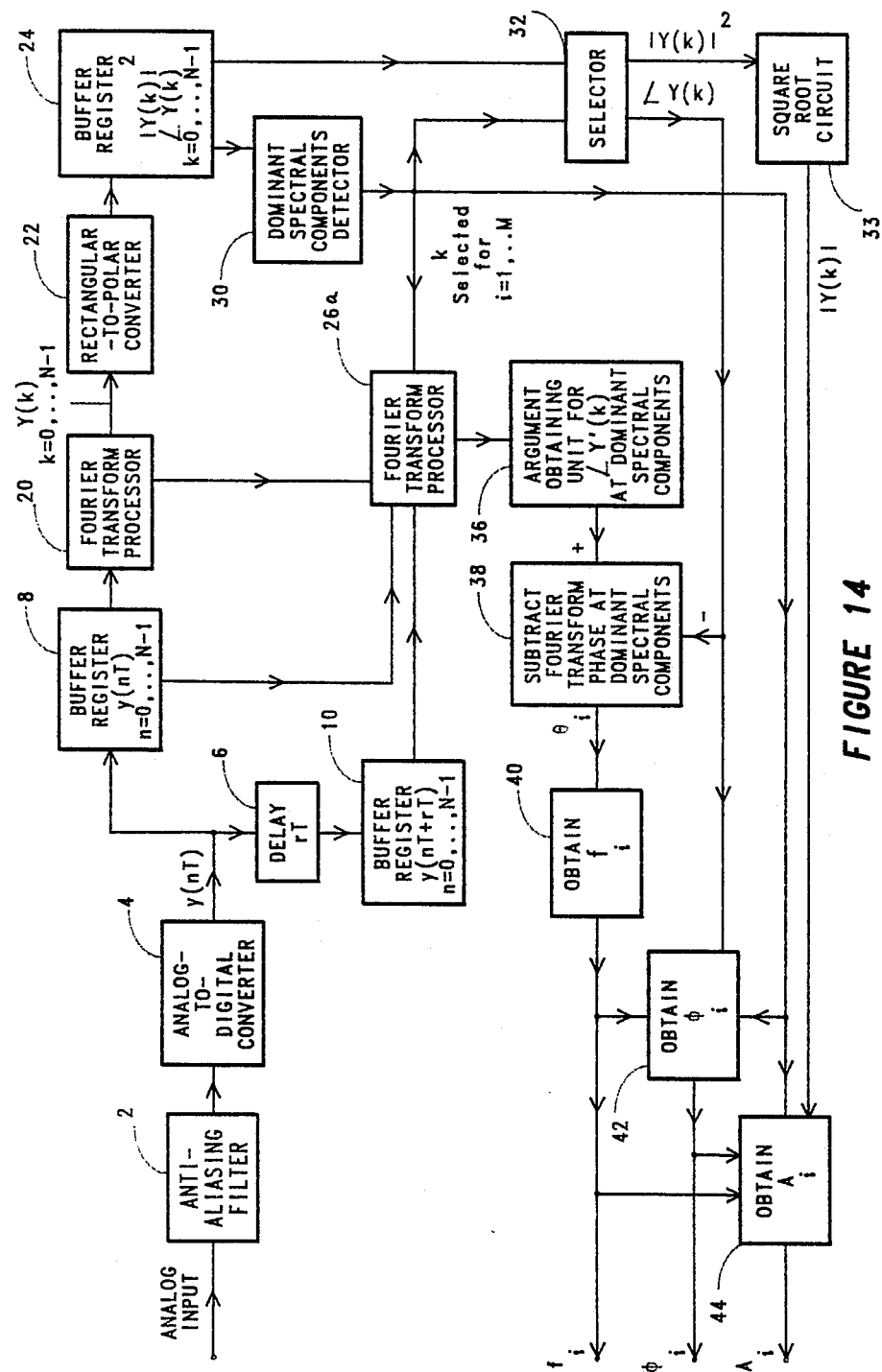
FIG. 14 shows a block diagram of a fifth embodiment of an apparatus in accordance with the present invention.

With reference to FIG. 13, there is shown an apparatus including a single input buffer register 8. The signal sample available is considered to be a signal having n samples where n=0 ... N+r−1. This signal sample is broken up to form an original signal, and a time-shifted signal. The signal samples in the range n=0 ... N−1 are treated as the original signal, whilst the signal samples in the range n=r ... N=r−1 are treated as the time-shifted signal.

It will be noted that these two signals overlap. This fact is used, to eliminate unnecessary duplication in the Fourier Transform calculation. The first Fourier Transform processor calculates the Fourier Transforms for the original signal. The Fourier Transform processor 26 utilizes this first transform to reduce the time needed to get the transform of the shifted signal. Thus, from the buffer register 8, the signal samples in the nonoverlap range are sent to the Fourier Transform processor 26, and the Fourier Transform of the relevant parts of the original signal are sent from the first Fourier Transform processor 20 to the second Fourier Transform processor 26. Again, this third embodiment otherwise operates as for the first embodiment.

Finally, turning to the fourth embodiment of the apparatus shown in FIG. 14, again the overlap between the original and time-shifted signals is utilized, to reduce the operations required. Here, the time delay rT is again applied to obtain a time-shifted signal. However, it is only applied to part of the original signal, and in the buffer register 10 only the additional values of the time-shifted signal are stored, which do not overlap the original signal. Again, like the third embodiment of FIG. 12, there is a Fourier Transform processor 26a, for just obtaining the Fourier Transform of the dominant spectral components. To reduce the effort required, it is supplied with the Fourier Transform of the original signals from the Fourier Transform processor 20. Additionally, the non-overlapping samples from the original and time-shifted signals are supplied from the buffer register 8, and the additional samples of the time-shifted signal are sent from the buffer register 10. Otherwise, this circuit functions as described for the first and third embodiments.

By way of example, reference will now be made to FIGS. 15–19, which show an application of the method and apparatus of the present invention.

These figures show a simulation carried out using the parameters listed in the following table 1.

TABLE 1

| A SET OF INPUT DATA FOR SIMULATION | | | | |
|---|---|---|---|---|
| Frequency bin size = 1/NT = 10000 Hz/ 512 = 19.531[Hz] | | | | |
| Sampling frequency = 1/T = 10000[Hz] | | | | |
| N = 512 | | | | |
| M = 5 | | | | |
| i | $A_i$ | $f_i$ [Hz] | $f_i$NT [cycles] | $\Phi_i$ [rad] |
| 1 | 1.00 | 9.76563 | 0.5 | 2.00 |
| 2 | 1.00 | 107.42188 | 5.5 | 2.00 |
| 3 | 1.00 | 400.39063 | 20.5 | 2.00 |
| 4 | 1.00 | 1005.85938 | 51.5 | 2.00 |
| 5 | 1.00 | 3994.14063 | 204.5 | 2.00 |

The frequencies were selected, such that they have different distances between adjacent sinusoids. Also, the frequency locations are all at the middle of frequency bins, so that all the local maxima of the side lobes of the window spectrum can be captured. In other words, maximum spectral leakage is displayed in the spectrum. The signal was processed by the outline above, using a Hanning window, and r equals to 1. The results of the simulation are given in the following table 2.

TABLE 2

| SIMULATION RESULT Hanning window used No additive noise r = 1 | | | | | |
|---|---|---|---|---|---|
| | | Estimated values | | | Error in $f_i$ estimation [Hz] |
| i | k | $A_i$ | $f_i$ [Hz] | $\Phi_i$ [rad] | |
| 1 | 1 | 0.84551 | 12.59449 | 1.71574 | −2.82887 |
| 2 | 5 | 0.98380 | 106.75054 | 2.10881 | 0.67134 |
| 3 | 20 | 0.99746 | 400.31091 | 2.01578 | 0.07972 |
| 4 | 52 | 0.99946 | 1005.87769 | 1.99392 | −0.01832 |
| 5 | 205 | 0.99995 | 3994.15430 | 1.99439 | −0.01368 |

FIG. 15 shows a graph of the original signal, given by the parameters of Table 1. FIG. 16 shows a graph of the resynthesized signal, according to the parameters given in Table 2. FIG. 17 shows the error waveform, on a larger scale. Two additional spectra or graphs are plotted in FIGS. 18 and 19; the first one is obtained from the original signal, whilst the second one in FIG. 19 is obtained from the estimation error waveform.

From the Table 2, we can see that the method obtained five dominant spectral constituents, corresponding generally closely to the original constituents of the original input signal. We can see that the main error in this resynthesized signal is from the estimation of the lower frequencies. This is apparent from the error waveform in FIG. 17, and also the error waveform spectrum in FIG. 19. The two lower frequencies are close together, so that the frequency estimations are more influenced by spectral leakage. In addition, they have less separation from their own negative frequencies than other higher frequency components. Higher net interferences therefore exist in these lower frequencies.

It is to be appreciated that the above description of the various embodiments of the apparatus and method are for an application in which one wishes to know the dominant spectral components of an unknown signal. This basic technique can be varied in numerous ways.

Whilst the above technique uses simultaneous processing of the original signal and a time-shifted signal, this is not always necessary. In some circumstances, it may be acceptable to use sequential processing. In this case, the original signal would be processed first, and then the time-shifted signal. In this case, one can eliminate much of the hardware or operations needed for the time-shifted signal.

Further, for example, in the phase obtaining unit 42, it may sometimes be desirable to operate on the argument of the time-shifted signal. In this case, the summation unit 148 should include an input for a quantity representative of the phase difference $2\pi f_i rT$.

Whilst the technique has been described as applied to a time-varying signal, it could be applied to a signal which varies in dependence upon another parameter, such as distance. Also, it is not always necessary to look for the dominant spectral components. In some circumstances, one may be interested in simply knowing the characteristics of a small part of the frequency spectrum. This can be selected.

In the case of components comprising complex exponential functions, the equation can be written as $$y(nT) = \sum_{i=1}^{M} A_i e^{j(2\pi f_i nT + \phi_i)} + A_0 \qquad 5$$

The process involved in finding $f_i$ and $\phi_i$ are identical to those for sinusoids. As for the evaluation of $A_i$, the phasors for the negative frequencies in equations 3, 8 and 9 are eliminated, reducing the number of terms by half.

The way to distinguish sine components from the complex exponential components is that for sine components there are corresponding magnitude peaks at both the positive and the negative frequencies of the transformed signal. Whereas exponential components have only one magnitude peak either at the positive frequency or at the negative frequency depending on the sign of the exponent.

For multi-dimensional signal analysis, the process is in parallel of the one-dimensional signal analysis.

Finally, whilst the described apparatus has been shown as different function units for clarity, these could be combined in various ways and implemented in one device or unit. The functions could be implemented, for example, optically or electronically. The devices can be analogue or digital.

It is expected that this technique could be applied to the decomposition or analysis of numerous signals, such as vibration signals. Such analysis makes it much easier to store data representative of the signal. Instead of having to store numerous sample points of the signal, one need simply store the amplitude, frequency and initial phase values for the dominant spectral constituents. This reduction in the data required to define a signal also facilitates transmission of the signal, and can be used to clean out or eliminate background noise.

The technique can be applied to relatively short data samples, and still obtain accurate results. It is anticipated that this may well enable Modems to handle a larger amount of data.

I claim:

1. An apparatus, for use in analysing a signal, the apparatus comprising:
   (i) delay means, for applying a delay to an original signal, to create a shifted signal and having an output;
   (ii) first transform means for applying a Fourier Transform to an original signal, to create a plurality of first frequency components, and having an output;
   (iii) second transform means connected to the output of the delay means, for applying a Fourier Transform to the shifted signal to create a plurality of second frequency components, the second transform means having an output for the second frequency components:
   (iv) argument obtaining means connected to the outputs of the first and second transform means for obtaining the arguments of the corresponding first and second frequency components and having an output for said arguments;
   (v) phase difference obtaining means, connected to the output of the argument obtaining means and having an output; and
   (vi) frequency obtaining means, connected to the output of the phase difference obtaining means, for obtaining the frequencies of the constituents of the original signal from said phase differences.

2. An apparatus as claimed in claim 1, which includes:
   (vii) a dominant spectral components detector, which is connected to an output of one of said first and second transform means, to determine dominant spectral components of the signal.

3. An apparatus as claimed in claim 1 or 2, which includes:
   (viii) initial phase obtaining means connected to the output of the argument obtaining means and to an output of the frequency obtaining means, for obtaining the initial phases of the constituents.

4. An apparatus as claimed in claim 3, which includes:
   (ix) a first amplitude obtaining means, connected to one of the first and second transform means, for obtaining the amplitudes of the frequency components; and
   (x) a second amplitude obtaining means, connected to the first amplitude obtaining means, the initial phase obtaining means and the frequency obtaining means, for obtaining the amplitudes of each said constituent from the respective frequency, the respective initial phase and the amplitude of the respective frequency component.

5. An apparatus as claimed in claim 4, wherein the argument obtaining means comprises:
   a rectangular-to-polar converter connected to an output of the first transform means, for obtaining the magnitude and argument of the first frequency components;
   and an argument obtaining unit, connected to the output of the second transform means and to an input of the phase difference obtaining means;
   the rectangular-to-polar converter also being connected to the input of the phase difference obtaining means and the rectangular-to-polar converter incorporating the first amplitude obtaining means.

6. An apparatus as claimed in claim 5, wherein the rectangular-to-polar converter derives the square of the amplitude of the first frequency components, and wherein a squre root unit is provided between the rectangular-to-polar converter and the second amplitude obtaining means.

7. An apparatus as claimed in claim 5, wherein the rectangular-to-polar converter is connected via a first selector to the phase difference obtaining means, and wherein the second transform means is connected via a second selector to the phase difference obtaining means.

8. An apparatus as claimed in claim 7, wherein the first and second transform means have their outputs connected to first and second output buffer registers, the first transform means being connected to the first output buffer register via the rectangular-to-polar converter.

9. An apparatus as claimed in claim 4, which includes a window coeffcent generator, for applying a window to both an original signal and a shifted signal.

10. An apparatus as claimed in claim 9, which further includes a window coefficient register, which has an input connected to the window coefficient generator and an output, and first and second window multipliers, which are connected respectively to inputs of the firat and second transform means, and have inputs connected to the output of the window coefficient register.

11. An apparatus as claimed in claim 11, which includes first and second input buffer registers, connected respectively to further inputs of the first and second window multipliers.

12. An apparatus as claimed in claim 11, which includes an antialiasing filter and an analogue-to-digital converter, which are connected in series, and are connected to an input of the first transform means, and via the delay means to the input of the second transform means.

13. An apparatus as claimed in claim 4, wherein the second amplitude obtaining means comprises: a first input for the amplitude of the respective frequency component; a second input for the product of the respective frequency component and the duration of a window for the original signal; a third input for the index of each frequency component; a first subtractor having a positive input connected to said second input and a negative input connected to said third input; a first adder having positive inputs connected to said second and third inputs; first and second increment units connected respectively to the outputs of the subtractor and the first adder, for adding the quantity 1; first and second decrement units connected respectively to outputs of the subtractor and the first adder for subtracting the quantity 1; six pairs of magnitude and argument deriving networks, the first pair of which is connected to the output of the subtractor, the second pair of which is connected to the output of the first increment unit, the third pair of which is connected to the output of the first decrement unit, the fourth pair of which is connected to the output of the second increment unit, the sixth pair of which is connected to the output of the second decrement unit, and each pair of which is connected to a respective multiplication unit; a summation unit having inputs connected to the outputs of said multiplication units and an output; a square, sum and square root circuit connected to the output of said square, sum and square root circuit and to the first input, for dividing the amplitude of the respective frequency component by the output of said circuit to derive the amplitude of the respective constituent of the original signal.

14. An apparatus as claimed in claim 13, wherein each of the magnitude networks includes means for determining the quantity $\gamma \sin(\pi S)/\sin(\pi S/N)$, where S is the input to the network, N is the number of samples of the original signal and $\gamma$ is a constant dependent on the type of window applied to the original signal, except when the input signal S is equal to zero, when the network provides the output $N\gamma$.

15. An apparatus as claimed in claim 13, wherein each of the argument derivation networks comprises: a multiplication unit having an input provided with the input signal for the network, and another input provided with the value $(1 - 1/N)\pi$; a respective adder having a first input connected to the output of the multiplication unit, and a second input supplied with the sum of the initial phase of the shifted signal and the respective phase difference less than the quanitity $\pi/2$; and a function unit connected to an output of the adder, the function unit in the first, second and third argument derivation networks calculating the function EXP (jP), P being the output of the adder, and for the fourth, fifth and sixth argument calculation networks calculates the function EXP(-jQ), Q being the output of the adder, the output of the function unit being the output of the respective argument calculation network.

16. An apparatus as claimed in claim 3, wherein the initial phase obtaining menas comprises: first, second and third inputs for respectively, the argument of the respective frequency component, the index corresponding to that frequency component and the frequency corresponding to that frequency component; a first adder having an input connected to said first input, and another input supplied with the value $\pi/2$; a first multiplier unit connected to the third input and to a fixed value NT; a first subtractor having a negative input connected to said second input and a positive input connected to an output of the first multiplier unit; a second multiplier unit having an input connected to the output of the subtractor and an input for the value $(1-1/N)\pi$; a second subtractor having a positive input connected to an output of the adder and a negative input connected to the output of the second multiplier unit; and a modular $2\pi$ unit connected to an output of the second subtractor, the output of the modular $2\pi$ unit being the initial phase for the corresponding constituent of the original signal.

17. An apparatus as claimed in claim 2, wherein the dominant spectral components detector comprises: a first comparator having two inputs for the magnitude of one frequency component and the magnitude of a preceding frequency component; a second comparator having two inputs for the magnitude of said one frequency component and the mgnitude of a subsequent frequency component; a third comparator having two inputs for the magnitude of said one frequency component and a threshold value; an AND gate having three inputs connected to outputs of three comparators; a one-shot unit connected to an output of the AND gate, whereby the one-shot unit delivers a signal if the magnitude of said one frequency component is greater than the magnitude of the preceding and subsequent frequency components and greater than the threshold value.

18. An apparatus as claimed in claim 2, wherein the dominant spectral components detector comprises: a subtractor having an input for an argument of one frequency component, and an input for the argument of an adjacent frequency component; and a comparison means connected to an output of the subtractor for comparing the output of the subtractor with the quantity $(1 - 1/N)\pi$, the comparison means sending a signal indicative of a dominant spectral component if the difference between the output of the subtractor and that value is less than a predetermined amount.

19. An apparatus as claimed in claim 18, wherein the comparison means comprises one comparator for comparing the output of the subtractor with an upper boundary value, and a second comparator for comparing the output of the subtractor with a lower boundary value.

20. An apparatus as claimed in claim 18 or 19, wherein the subtractor is connected to the comparison means via a circuit for adding the quantity $2\pi$ to the output of the subtractor, if the subtractor output is negative, so that the comparison means receives a positive value.

21. An apparatus means as claimed in claim 18 or 19 which further comprises: a first comparator having one input for the magnitude of one frequency component and another input for the magnitude of a preceding frequency component; a second comparator having an input for the magnitude of said one frequency component and the magnitude of a subsequent frequency component; a third comparator having an input for the magnitude of said one frequency component and an input for a threshold value; an AND gate having three inputs connected to outputs of the first, second and third comparators; a one-shot unit, connected to an output of the AND gate; and an output AND gate having an input connected to the output of the one-shot unit and an input connected to an output of the comparison means; whereby, in use, said output AND gate provides a signal indicative of a dominant spectral component, when the magnitude of a frequency component is greater than or equal to the magnitude of subsequent and preceding components and is greater than a predetermined threshold value, and when the difference between the argument of that frequency component and the argument of a subsequent or preceding component is equal to the value $(1-1/N)\pi$ within a predetermined tolerance.

22. An apparatus as claimed in claim 17, 18 or 19, which additional includes an increment counter, for recording the number of dominant spectral components, and a recorder, for recording the index values corresponding to the dominant spectral components.

23. An apparatus as claimed in claim 1 or 2, wherein the delay means applies a time delay to the signal.

24. An apparatus as claimed in claim 1, wherein the frequency obtaining means comprises: a circuit for adding the value $2\pi$ to the respective phase difference when that phase difference is less than 0, to produce an adjusted phase difference value; and a divider connected to the output of said circuit for dividing the adjusted phase difference value by $2\pi$ and the duration of the timing delay.

* * * * *